United States Patent
Tan et al.

(10) Patent No.: US 9,922,589 B2
(45) Date of Patent: Mar. 20, 2018

(54) EMISSION ELECTRODE SCANNING CIRCUIT, ARRAY SUBSTRATE AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Wen Tan, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 0 days.

(21) Appl. No.: 14/764,316

(22) PCT Filed: Oct. 30, 2014

(86) PCT No.: PCT/CN2014/089904
§ 371 (c)(1),
(2) Date: Jul. 29, 2015

(87) PCT Pub. No.: WO2016/000369
PCT Pub. Date: Jan. 7, 2016

(65) Prior Publication Data
US 2016/0300523 A1   Oct. 13, 2016

(30) Foreign Application Priority Data
Jul. 4, 2014   (CN) .......................... 2014 1 0318306

(51) Int. Cl.
*G09G 5/10*   (2006.01)
*G09G 3/20*   (2006.01)
(Continued)

(52) U.S. Cl.
CPC ......... *G09G 3/2092* (2013.01); *G06F 3/0412* (2013.01); *G06F 3/0416* (2013.01);
(Continued)

(58) Field of Classification Search
CPC ......... G09G 3/2092; G09G 2300/0809; G09G 2310/0202; G09G 2310/0286;
(Continued)

(56) References Cited

U.S. PATENT DOCUMENTS

| 6,420,430 B1 | 7/2002 | Linz et al. |
| 2008/0018613 A1 | 1/2008 | Kim et al. |

(Continued)

FOREIGN PATENT DOCUMENTS

| CN | 101614898 A | 12/2009 |
| CN | 101996684 A | 3/2011 |

(Continued)

OTHER PUBLICATIONS

International Search Report Appln. No. PCT/CN2014/089904, dated Apr. 13, 2015.
(Continued)

*Primary Examiner* — Peter D McLoone
(74) *Attorney, Agent, or Firm* — Ladas & Parry LLP (57) ABSTRACT

There provide an emission electrode scanning circuit, an array substrate and a display apparatus. The emission electrode scanning circuit includes a plurality of sub scanning circuits connected in cascades, each of which includes a shift register unit, a scanning signal generation unit and a driving output unit. Each sub scanning circuit provides a driving signal to the emission electrode respectively, thereby avoiding bringing in a plurality of driving signal lines from outside of the array substrate. And the plurality of sub scanning circuits shares the emission electrode driving signal line and needs an input of only one start signal to drive
(Continued)

the emission electrode scanning circuit to send the emission electrode driving signal progressively. The emission electrode scanning circuit is suitable to be integrated in the seal region of the array substrate, without setting the Fan-out having numerous input lines, which is advantageous for implementing the narrow frame of the display apparatus and also avoids crosstalk produced between the input lines and the gate voltage lines.

20 Claims, 6 Drawing Sheets (51) Int. Cl.
  *G06F 3/041* (2006.01)
  *G09G 3/36* (2006.01)
  *G11C 19/28* (2006.01)
  *G06F 3/044* (2006.01)
(52) U.S. Cl.
  CPC .......... *G09G 3/3677* (2013.01); *G06F 3/044* (2013.01); *G09G 2300/0809* (2013.01); *G09G 2310/0202* (2013.01); *G09G 2310/0267* (2013.01); *G09G 2310/0286* (2013.01); *G09G 2310/0289* (2013.01); *G09G 2320/0209* (2013.01); *G11C 19/28* (2013.01); *G11C 19/287* (2013.01)
(58) Field of Classification Search
  CPC .......... G09G 2320/0209; G06F 3/0412; G06F 3/0416; G11C 19/28
  See application file for complete search history.

(56) References Cited

U.S. PATENT DOCUMENTS

| | | | |
|---|---|---|---|
| 2010/0007632 A1* | 1/2010 | Yamazaki | ........... H01L 27/3234 345/175 |
| 2011/0096027 A1 | 4/2011 | Jeon et al. | |
| 2012/0105338 A1 | 5/2012 | Lin et al. | |
| 2013/0127779 A1 | 5/2013 | Lillie et al. | |
| 2015/0277651 A1 | 10/2015 | Zhang et al. | |

FOREIGN PATENT DOCUMENTS

| | | |
|---|---|---|
| CN | 102999217 A | 3/2013 |
| CN | 103500039 A | 1/2014 |
| CN | 203456069 U | 2/2014 |
| CN | 103823589 A | 5/2014 |
| CN | 104103253 A | 10/2014 |
| CN | 204029332 tJ | 12/2014 |
| EP | 2713361 A1 | 4/2014 |
| JP | 5983238 A | 5/1984 |

OTHER PUBLICATIONS

Written Opinion of the International Searching Authority Appln. No. PCT/CN2014/089904, dated Apr. 13, 2015.
First Chinese Office Action Appln. No. 20140318306.1, dated Nov. 3, 2015.
Extended European Search Report dated Jan. 24, 2018; Appln. No. 148821162.2.

* cited by examiner

Fig. 1

--Prior Art--

EMISSION ELECTRODE SCANNING CIRCUIT, ARRAY SUBSTRATE AND DISPLAY APPARATUS

TECHNICAL FIELD

The present disclosure relates to an emission electrode scanning circuit, an array substrate and a display apparatus.

BACKGROUND

In-cell touch screen panel (In-cell TSP) technology is an important development direction of the current TSP technology. In an in-cell touch screen panel, common electrodes (VCOM ITO) at the top layer are always used as emission (TX) electrodes. Whereas in the traditional design, TX driving signals over VCOM ITO are joined by an external driving IC through a Fan-out located in a seal region.

With the increasing of size of the panel, the amount of emission electrodes would increase. Then, disposing the emission Fan-out (TX Fan-out) requires more space. Therefore, the emission electrodes in a manner of Fan-out are affected by the width of the seal region, which limits the in-cell technology to be applied to a large-size and narrow-frame panel. In addition, the TX Fan-out is located above or below Gate Driver on Array (GOA), and signal crosstalk results in the mutual influence of the emission electrode and GOA, which causes the reliability problem of touch and panel display.

SUMMARY

There provides in embodiments of the present disclosure an emission electrode scanning circuit, comprising a plurality of sub scanning circuits connected in cascades, each of which comprises a shift register unit, a scanning signal generation unit and a driving output unit, wherein:

the shift register unit is configured to shift a received start signal to obtain a start signal of a next stage of sub scanning circuit and an emission electrode driving control signal, output the start signal of the next stage of sub scanning circuit to a shift register unit of the next stage of sub scanning circuit, and output obtained emission electrode driving control signal to the scanning signal generation unit;

the scanning signal generation unit is connected to an emission electrode driving signal line, and is configured to generate an emission electrode scanning signal according to the emission electrode driving control signal received from the shift register unit and an emission electrode driving signal received from the emission electrode driving signal line and input obtained emission electrode scanning signal to a scanning signal input terminal of the driving output unit; and the driving output unit is configured to convert a high level of a received emission electrode scanning signal into an emission electrode driving high level and convert a low level of the received emission electrode scanning signal into an emission electrode driving low level, and output them to an emission electrode.

Alternatively, the shift register unit is further configured to output an inverse signal of the emission electrode driving control signal to the scanning signal generation unit;

the scanning signal generation unit comprises five thin film transistors, wherein a first thin film transistor and a second thin film transistor are P channel type thin film transistors, and a third thin film transistor, a fourth thin film transistor and a fifth thin film transistor are N channel type thin film transistors; and gates of the first thin film transistor and the fifth thin film transistor are connected to the inverse signal of the emission electrode driving control signal; a source of the first thin film transistor is connected to a bias high level, and a drain thereof is connected to a source of the second thin film transistor; and a source of the fifth thin film transistor is connected to an output terminal of the scanning signal generation unit, and as drain thereof is connected to a bias low level;

gates of the second thin film transistor and the fourth thin film transistor are connected to the emission electrode driving signal line; a drain of the second thin film transistor is connected to the output terminal of the scanning signal generation unit; and a source of the fourth thin film transistor is connected to the bias low level, and a drain thereof is connected to a source of the third thin film transistor; and a gate of the third thin film transistor is connected to the emission electrode driving control signal, and a drain thereof is connected to the output terminal of the scanning signal generation unit.

Alternatively, the shift register unit is further configured to output the inverse signal of the emission electrode driving control signal to the scanning signal generation unit;

the scanning signal generation unit comprises five thin film transistors, wherein a first thin film transistor and a second thin film transistor are P channel type thin film transistors, and a second thin film transistor, a third thin film transistor and a fourth thin film transistor are N channel type thin film transistors; and gates of the first thin film transistor and the third thin film transistor are connected to the emission electrode driving signal line; a source of the first thin film transistor is connected to a bias high level, and a drain thereof is connected to a source of the second thin film transistor; and a source of the third thin film transistor is connected to a source of the fourth thin film transistor, and a drain thereof is connected to an output terminal of the scanning signal generation unit;

gates of the second thin film transistor and the fifth thin film transistor are connected to the inverse signal of the emission electrode driving control signal; a drain of the second thin film transistor is connected to the output terminal of the scanning signal generation unit; and a source of the fifth thin film transistor is connected to the bias low level, and a drain thereof is connected to the output terminal of the scanning signal generation unit.

A gate of the fourth thin film transistor is connected to the emission electrode driving control signal, and a source thereof is connected to the bias low level.

Alternatively, the scanning signal generation unit comprises a not-and gate and an inverter; one input terminal of the not-and gate is connected to the emission electrode driving signal line, and the other input terminal thereof is connected to the emission electrode driving control signal, and an output terminal thereof is connected to an input terminal of the inverter; and an output terminal of the inverter is connected to the output terminal of the scanning signal generation unit.

Alternatively, the driving output unit comprises two transfer gates, wherein a positive control terminal of a first transfer gate and a negative control terminal of a second transfer gate are connected to the emission electrode scanning signal; the negative control terminal of the first transfer gate and the positive control terminal of the second transfer gate are connected to an inverse signal of the emission electrode scanning signal; and output terminals of the first transfer gate and the second transfer gate are connected to the emission electrode; a voltage input terminal of the first transfer gate is connected to the emission electrode driving low level, and a voltage input terminal of the second transfer gate is connected to the emission electrode driving high level.

Alternatively, the driving output unit comprises sixth, seventh, eighth, and ninth thin film transistors, wherein the sixth thin film transistor and the eighth thin film transistor are two P channel type thin film transistors, and the seventh thin film transistor and the ninth thin film transistors are N channel type thin film transistors; and gate of the sixth thin film transistor and the seventh thin film transistor are connected to the output terminal of the scanning signal generation unit; a source of the sixth thin film transistor is connected to the driving high level, and a drain thereof is connected to a drain of the seventh thin film transistor; and a source of the seventh thin film transistor is connected to the driving low level;

gates of the eighth thin film transistor and the ninth thin film transistor are connected to a drain of the seventh thin film transistor; a source of the eighth thin film transistor is connected to the driving high level, and a drain thereof is connected to the emission electrode; and a source of the ninth thin film transistor is connected to the bias low level, and a drain thereof is connected to the emission electrode.

There provides in the present disclosure an array substrate, comprising the emission electrode scanning circuit described above.

Alternatively, the emission electrode scanning circuit is integrated in a seal region of the array substrate.

Alternatively, common electrodes of multiple rows of pixels of the array substrate form one row of emission electrodes.

There further provides in the present disclosure a display apparatus, comprising the array substate described above.

The emission electrode scanning circuit provided in the present disclosure comprises a plurality of sub scanning circuits connected in cascades, each of which provides a driving signal to the emission electrode respectively, thereby avoiding from bringing a plurality of driving signal lines outside the array substrate. And the plurality of sub scanning circuits shares the emission electrode driving signal line and needs an input of only one start signal to drive the emission electrode scanning circuit to send the emission electrode driving signal progressively. Thus, the emission electrode scanning circuit of the present disclosure is suitable to be integrated in the seal region of the array substrate, without setting the Fan-out having numerous input lines, which is advantageous for implementing the narrow frame of the display apparatus and also avoids crosstalk produced between the input lines and the gate voltage lines.

DETAILED DESCRIPTION

Specific implementations of the present disclosure are further described below in combination with the accompanying figures. Following embodiments are just used to described technical solutions of the present disclosure more clearly, but not used to limit the protection scope of the present disclosure.

In order to make it convenient for description, some terms mentioned in the present disclosure are explained firstly:

GOA_STV is a start signal of GOA;

GOA_CLK and GOA_CLKB are a pair of clock signals of GOA which inverse to each other;

TX Scanner is an emission electrode scanning circuit;

TX_STV is a start signal of TX scanner;

TX_CLK and TX_CLKB are a pair of clock signals of TX Scanner which inverse to each other;

TX_CN is an emission electrode driving control signal;

/TX_CN is an inverse signal of CN;

TX is an emission electrode driving signal;

TX_OUT is an emission electrode scanning signal;

/TX_OUT is an inverse signal of TX_OUT;

TXCOM is a high level of TX driving voltage;

DCCOM is a low level of TX driving voltage, and is equal to a direct current common level displayed by LCD;

VGH is a bias high level;

VGL is a bias low level;

TX Scan unit is one sub scanning circuit of TX Scanner;

S/R is a shift register unit;

TX_1, TX_2, TX_3, . . . , TX_n−1, TX_n, TX_n+1, . . . , TX_last are driving electrodes or driving signals in corresponding rows;

COMOUT_1, COMOUT_2, COMOUT_3, . . . , COMOUT_n−1, COMOUT_n, COMOUT_n+1, . . . , COMPUT_last_level are common electrode signals received by the driving electrodes in corresponding rows.

Herein, STV_OUT and TX_CN are signal obtained by S/R shifting STV.

Herein, high levels of GOA_STV, GOA_CLK, GOA_CLKB, TX_STV, TX_CLK, TX_CLKB and TX signals are VGH, low levels thereof are VGL, and VGL<DCCOM<TXCOM<VGH.

Figure 1:
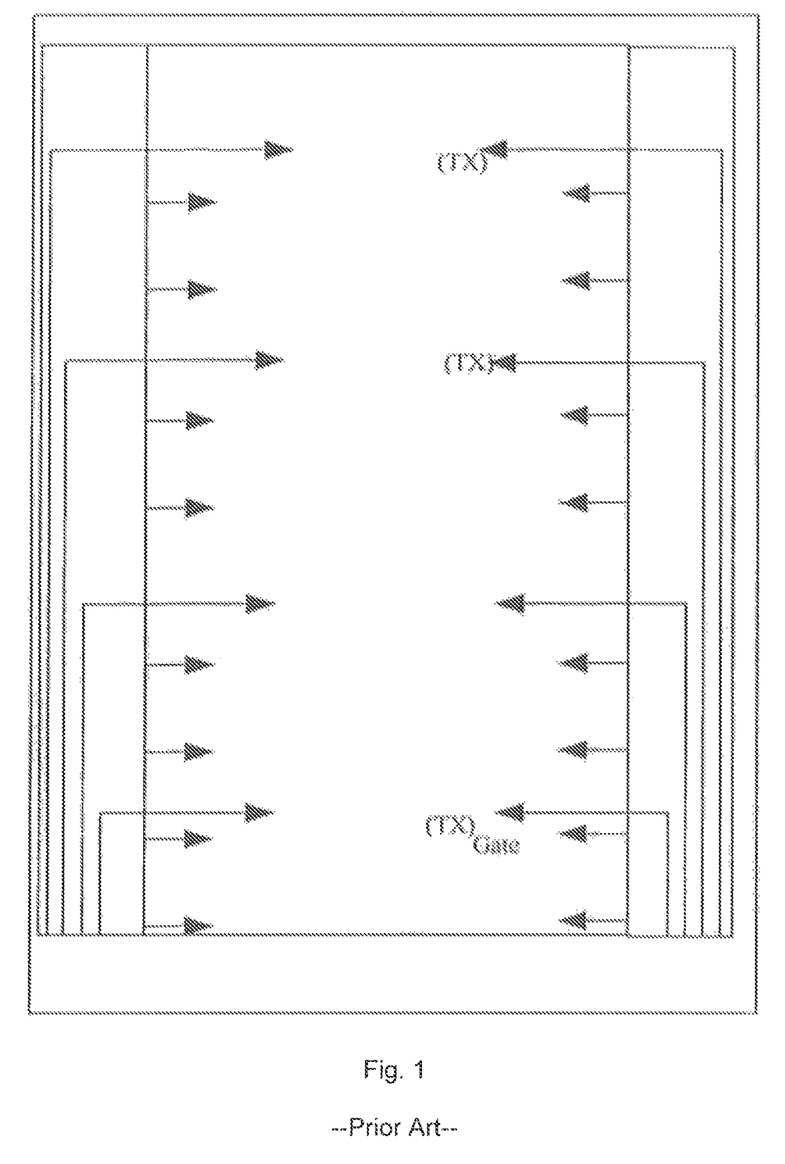
FIG. 1 is a schematic diagram of a structure of a known display panel.

FIG. 1 is a schematic diagram of a structure of a known display panel. As shown in FIG. 1, in the traditional design, TX driving signals over VCOM ITO are applied by an external driving IC through the Fan-out located in the seal region.

Figure 2:
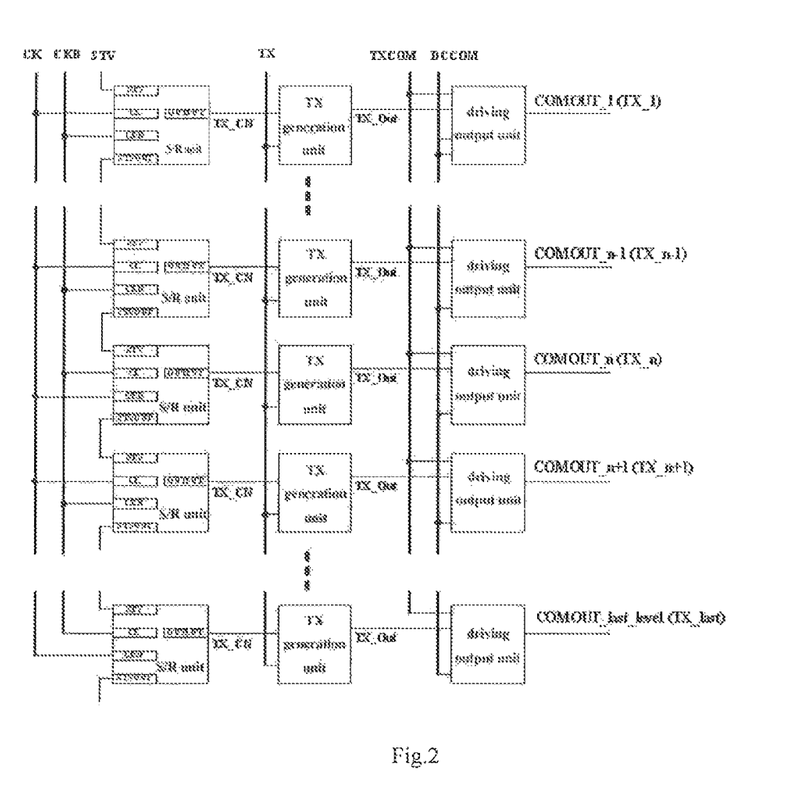
FIG. 2 is a schematic diagram of a structure of an emission electrode scanning circuit provided in an embodiment of the present disclosure.

FIG. 2 is a schematic diagram of a structure of an emission electrode scanning circuit (TX scanner) provided in an embodiment of the present disclosure. As shown in FIG. 2, the circuit comprises a plurality of sub scanning circuits TX Scan unit connected in cascades, each of which comprises a shift register unit S/R, a scanning signal generation unit (TX generation unit) and a driving output unit. The TX generation unit is connected to the shift register unit S/R and the driving output unit respectively.

In the circuit of FIG. 2, the shift register unit S/R is configured to, under the control of TX_CLK and TX_CLKB, shift a received STV to obtain STV_OUT and TX_CN, input STV_OUT to a next stage of sub scanning circuit TX Scan unit as a STV of the next stage of sub scanning circuit TX Scan unit, and input TX_CN as an emission electrode driving control signal to the TX generation unit;

The TX generation unit is the scanning signal generation unit, which is configured to generate an emission electrode scanning signal TX_OUT according to TX_CN and TX;

The driving output unit is configured to convert a received high level signal of TX_OUT into TXCOM, convert a low level signal of TX_OUT into DCCOM, and then output them to an emission electrode.

In actual application, VGL and VGH are generally operating voltages of the circuit and always have large voltage values, while driving TX does not need such large voltage. Therefore, the embodiment of the present disclosure converts it into a lower voltage. Herein, TXCOM can be a voltage needed to detect IC, and DCCOM can be a common electrode voltage.

The emission electrode scanning circuit provided in the embodiment of the present disclosure comprises a plurality of sub scanning circuits connected in cascades, each of which provides a driving signal to the emission electrode respectively, thereby avoiding bringing in a plurality of driving signal lines from outside of the array substrate. And the plurality of sub scanning circuits shares the emission electrode driving signal line and needs only an input of one start signal to drive the emission electrode scanning circuit to send the emission electrode driving signal progressively. Thus, the emission electrode scanning circuit in the embodiment of the present disclosure is suitable to be integrated in the seal region of the array substrate, without setting the Fan-out having numerous input lines, which is advantageous for implementing the narrow frame of the display apparatus and also avoids crosstalk produced between the input lines and the gate voltage lines.

Figure 3:
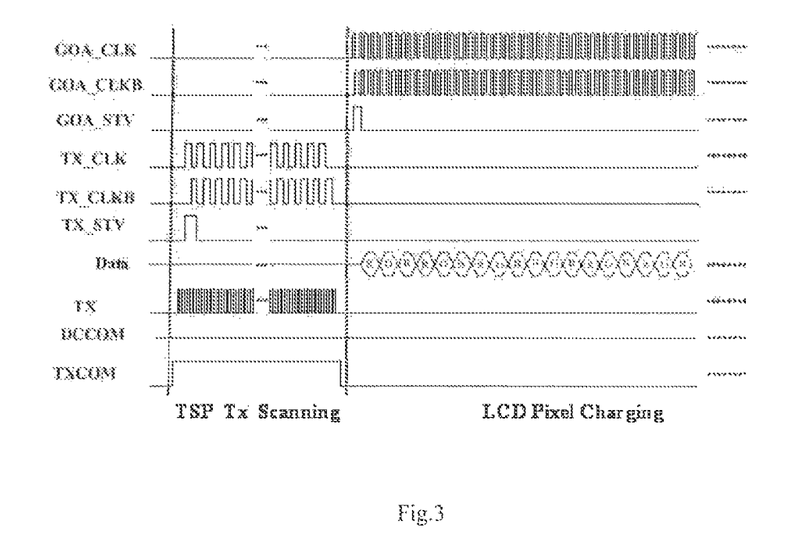
FIG. 3 is a schematic diagram of external driving signals of an emission electrode scanning circuit and GOA provided in an embodiment of the present disclosure.

FIG. 3 is a schematic diagram of external driving signals integrated with the emission electrode scanning circuit and GOA provided in the present disclosure.

As shown in FIG. 3, in a LCD display phase (LCD pixel charging as shown in the Figure), GOA_CLK and GOA_CLKB are input a clock square wave, GOA_STV is input a start square wave signal, GOA operates, a SD (source-drain) line is input a pixel gray scale voltage, and a panel refreshes a frame picture. In this phase, TX_CLK, TX_CLKB, TX_STV and TX are maintained as VGL, and DCCOM and TXCOM are maintained as COM voltage, that is, the operation of the emission electrode scanning circuit is suspended, and VCOM ITO outputs a COM direct current voltage.

In a touch detection phase (TSP Tx scanning as shown in the figure), TX_CLK and TX_CLKB are input the clock square wave, TX_STV is input the start square wave signal, and the emission electrode scanning circuit operates, continuously outputs TX driving signals as VCOM ITO of TX electrodes, and outputs driving signals TX_1, TX_2 to TX_n from COM_1 to COM_n progressively. In this phase, GOA_CLK, GOA_CLKB and GOA_STV are maintained as VGL, DCCOM is COM level, and TXCOM is the high level VDD needed for RX detection of driving IC. That is, the operation of GOA circuit is suspended, and the emission electrode scanning circuit outputs TX driving signals to VCOM ITO progressively.

An exemplary optional solution is that the shift register unit S/R is further configured to output an inverse signal /TX_CN of TX_CN to the TX generation unit. Now, as shown in FIG. 4, a specific structure of the TX generation unit in the sub scanning circuit TX Scan unit can comprise: five thin film transistors (TFT) T1, T2, T3, T4, T5, wherein T1 and T2 are P channel type TFTs, and T3, T4, and T5 are N channel type TFTs.

Figure 4:
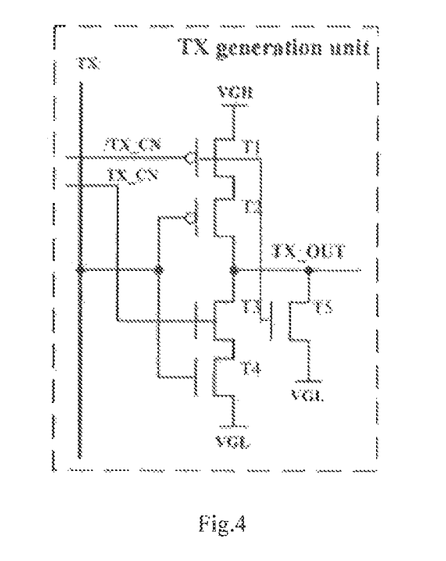
FIG. 4 is a schematic diagram of a structure of a TX generation unit in an emission electrode scanning circuit provided in an embodiment of the present disclosure.

In FIG. 4, gates of T1 and T5 are connected to the inverse signal /TX_CN; a source of T1 is connected to VGH, and a drain thereof is connected to a source of T2; a drain of T5 is connected to an output terminal TX_OUT of the TX generation unit, and a source thereof is connected to VGL;

gates of T2 and T4 are connected to the TX signal line; a drain of T2 is connected to the output terminal TX_OUT of the TX generation unit; a source of T4 is connected to VGL, and a drain thereof is connected to a source of T3;

a gate of T3 is connected to TX_CN, and a drain thereof is connected to the output terminal of the TX generation unit.

In actual application, an inverter can be disposed in the shift register unit S/R or TX generation unit, so as to invert TX_CN to obtain the inverse signal /TX_CN. Then, the inverse signal /TX_CN is connected to the gates of T1 and T5, and TX_CN is connected to the gate of T3.

Figure 5:
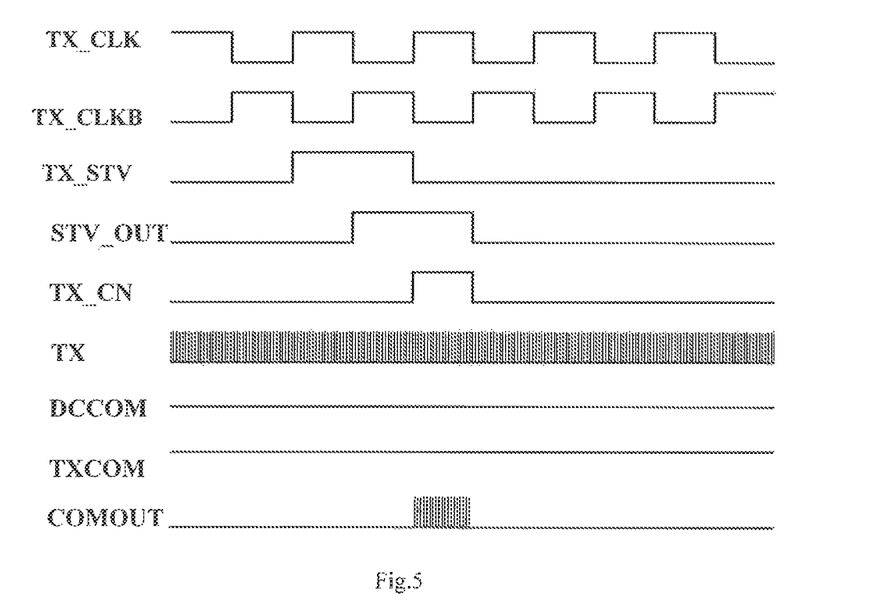
FIG. 5 is a timing diagram of respective signals when an emission electrode scanning circuit provided in an embodiment of the present disclosure operates.

FIG. 5 is a timing diagram of respective signals when the sub scanning circuit of the TX generation unit in FIG. 4 operates. When TX_CN is the high level VGH and /TX_CN are the low level VGL, T1 and T3 are turned on, T5 is turned off, and the TX generation unit outputs a high-frequency scanning signal TX_OUT within a TX electrode scanning time by controlling T2 and T4. After TX_OUT is input to the driving output unit, the driving output unit converts the high and low levels of TX_OUT from VGH and VGL into TXCOM and DCCOM, and outputs them to the TX electrode.

Figure 6:
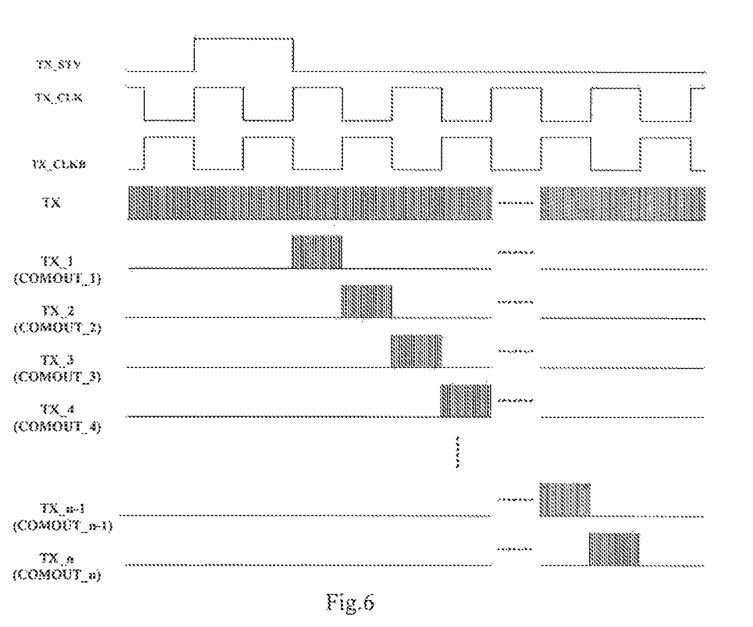
FIG. 6 is a timing diagram of respective signals when another TX scanner provided in an embodiment of the present disclosure operates.

FIG. 6 shows a waveform graph of driving signals output to respective TX electrodes (TX_1, TX_2, TX_3, . . . , TX_n−1, TX_n). As shown in FIG. 6, in the display phase, the respective TX electrodes correspondingly receives the common electrode signals (COMOUT_1, COMOUT_2, COMOUT_3, COMOUT_n−1, COMOUT_n).

The shift register unit S/R is further configured to output the inverse signal /TX_CN of TX_CN to the TX generation unit.

Figure 7:
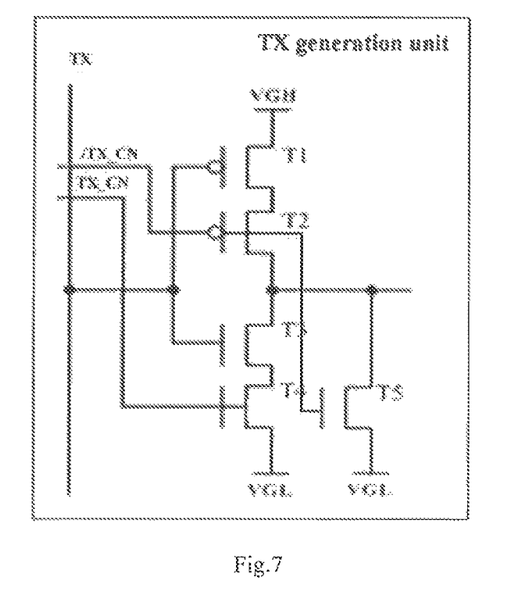
FIG. 7 is a schematic diagram of a structure of another TX generation unit in an emission electrode scanning circuit provided in an embodiment of the present disclosure.

FIG. 7 shows a schematic diagram of another structure of the TX generation unit. As shown in FIG. 7, the TX generation unit comprises: five thin film transistors (TFT) T1, T2, T3, T4, T5, wherein T1 and T2 are P channel type TFTs, and T3, T4 and T5 are N channel type TFTs.

Gates of T1 and T3 are connected to the TX signal line; a source of T1 is connected to VGH, a drain thereof is connected to a source of T2; a source of T3 is connected to a drain of T4, and a drain thereof is connected to the output terminal of the TX generation unit;

Gates of T2 and T5 are connected to /TX_CN; a drain of T2 is connected to the output terminal of the TX generation unit; a source of T5 is connected to VGL, and a drain thereof is connected to the output terminal of the TX generation unit;

A gate of T4 is connected to TX_CN, and a source thereof is connected to VGL.

By using the structure as shown in FIG. 7, when TX_CN is the high level VGH and /TX_CN is the low level VGL, T4 and T2 are turned on, T5 is turned off, TX outputs the high-frequency scanning signal TX_OUT within the TX electrode scanning time by controlling T1 and T3. After TX_OUT is input to the driving output unit, the driving output unit converts the high and low levels of TX_OUT from VGH and VGL into TXCOM and DCCOM, and outputs them to the TX electrode.

Of course, the shift register unit S/R can output only TX_CN.

Figure 8:
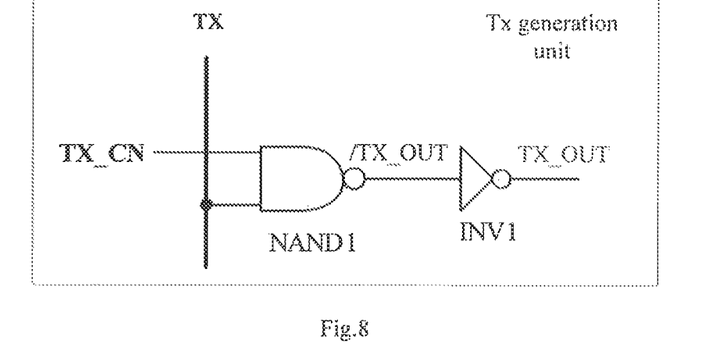
FIG. 8 is a schematic diagram of a structure of another TX generation unit in an emission electrode scanning circuit provided in an embodiment of the present disclosure.

FIG. 8 shows a schematic diagram of a structure of the TX generation unit when the shift register unit S/R outputs only TX_CN. As shown in FIG. 8, the TX generation unit comprises: a non-and gate NAND1 and an inverter INV1; one input terminal of NAND1 is connected to the TX signal line, the other input terminal thereof is connected to TX_CN, and the output terminal /TX_OUT is connected to an input terminal of INV1; an output terminal of INV1 is connected to the output terminal TX_OUT of the TX generation unit.

At this time, the operating principle of the circuit is: when TX_CN is at the high level, the high-frequency TX signal outputs TX_OUT through NAND1 and INV1; when TX_CN is at the low level, the high-frequency TX signal would not be output.

Figure 9:
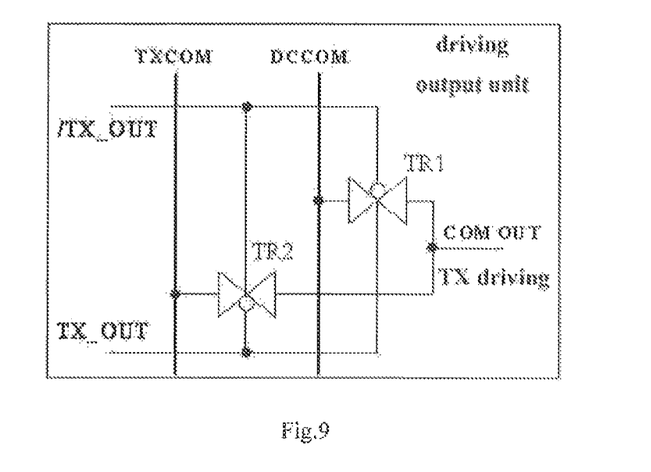
FIG. 9 is a schematic diagram of a structure of a driving output unit in an emission electrode scanning circuit provided in an embodiment of the present disclosure.

FIG. 9 is a schematic diagram of a structure of a driving output unit in the emission scanning circuit provided in an embodiment of the present disclosure. As shown in FIG. 9, an exemplary structure of the driving output unit in FIG. 2 can comprise two transfer gates TR1 and TR2.

Herein, a positive control terminal of TR1 and a negative control terminal of TR2 are connected to TX_OUT; the negative control terminal of TR1 and the positive control terminal of TR2 are connected to the inverse signal /TX_OUT of TX_OUT;

output terminals of TR1 and TR2 are connected to the emission electrode (i.e., outputting the TX driving signal or the common electrode signal COMOUT); a voltage input terminal of TR1 is connected to DCCOM, and a voltage input terminal of TR2 is connected to TXCOM.

The operating principle of the driving output unit is: when TX_OUT and /TX_OUT are input the high-frequency TX driving control signal, TR1 and TR2 are turned on alternatively to output a high-frequency TX driving square wave signal having TXCOM and DCCOM as a high level and a low level; when the TX driving control signals TX_OUT and /TX_OUT are input VGH and VGL respectively, TR1 is turned on, TR2 is turned off, and the output terminal outputs DCCOM level.

It is needed to point out that when the driving output unit has the structure as shown in FIG. 9, the corresponding TX generation unit can be the TX generation unit as shown in FIG. 8. Or, the TX generation unit in FIG. 4 or FIG. 7 can be used, and at this time, it is needed to additionally add an inverter to the circuit, so as to provide TX_OUT and /TX_OUT for the driving output unit as shown in FIG. 9.

Figure 10:
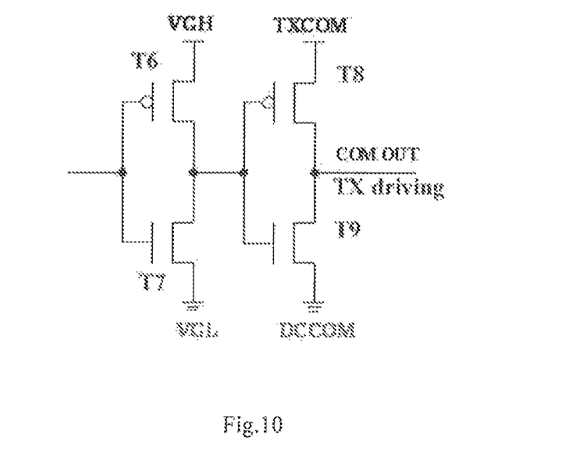
FIG. 10 is a schematic diagram of a structure of another driving output unit in an emission electrode scanning circuit provided in an embodiment of the present disclosure.

FIG. 10 is a schematic diagram of a structure of another driving output unit in the emission electrode scanning circuit provided in the embodiment of the present disclosure. As shown in FIG. 10, another exemplary structure of the driving output unit in FIG. 2 can comprise: four TFTs, i.e., T6, T7, T8, and T9, wherein T6 and T8 are P channel type TFTs, and T7 and T9 are N channel type TFTs.

Herein, gates of T6 and T7 are connected to the output terminal of the TX generation unit; a source of T6 is connected to VGH, and a drain thereof is connected to a drain of T7; and a source of T7 is connected to VGL.

Gates of T8 and T9 are connected to the source of T7; a source of T8 is connected to TXCOM, a drain thereof is connected to the emission electrode; a source of T9 is connected to DCCOM, and a drain thereof is connected to the emission electrode (i.e., outputting the TX driving signal or the common electrode signal COMOUT).

In this way, it is equivalent that T6 and T7 constitute a buffer inverter of a first stage, whose operating high and low levels are VGH and VGL, wherein T8 and T9 constitute an output driving inverter of a second stage, whose operating high and low levels are TXCOM and DCCOM. After passing through the buffer inverter and the output driving inverter, TX_OUT outputs high-frequency TX driving square wave signals having TXCOM and DCCOM as the high and low levels respectively to the emission electrode.

It is easy to understand that when the structure as shown in FIG. 10 is selected as the structure of the driving output unit, the TX generation unit can select any one of the TX generation units described above. No matter the input signal is TX_OUT or /TX_OUT, the driving output unit is capable of providing the driving voltage for TX according the input signal.

Based on the same concept, the present disclosure further provides an array substrate, comprising the emission electrode scanning circuit described above.

Figure 11:
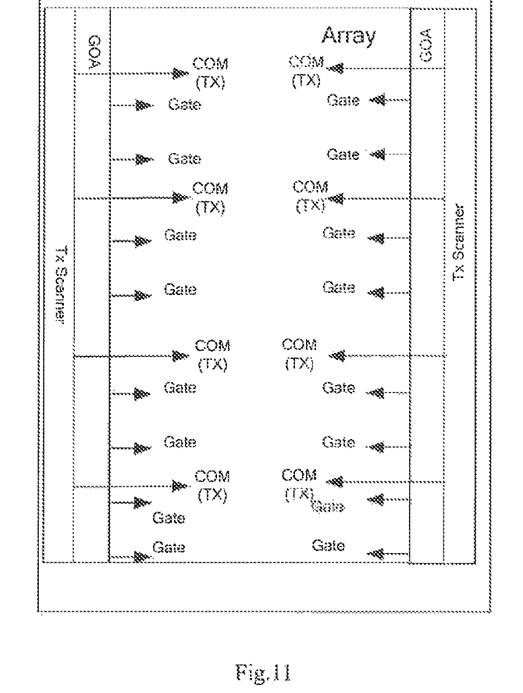
FIG. 11 is a schematic diagram of a structure of a display apparatus provided in an embodiment of the present disclosure.

FIG. 11 is a schematic diagram of a structure of a display apparatus provided in an embodiment of the present disclosure.

Exemplarily, as shown in FIG. 11, the emission electrode scanning circuit is integrated in the seal region of the array substrate Array.

Figure 12:
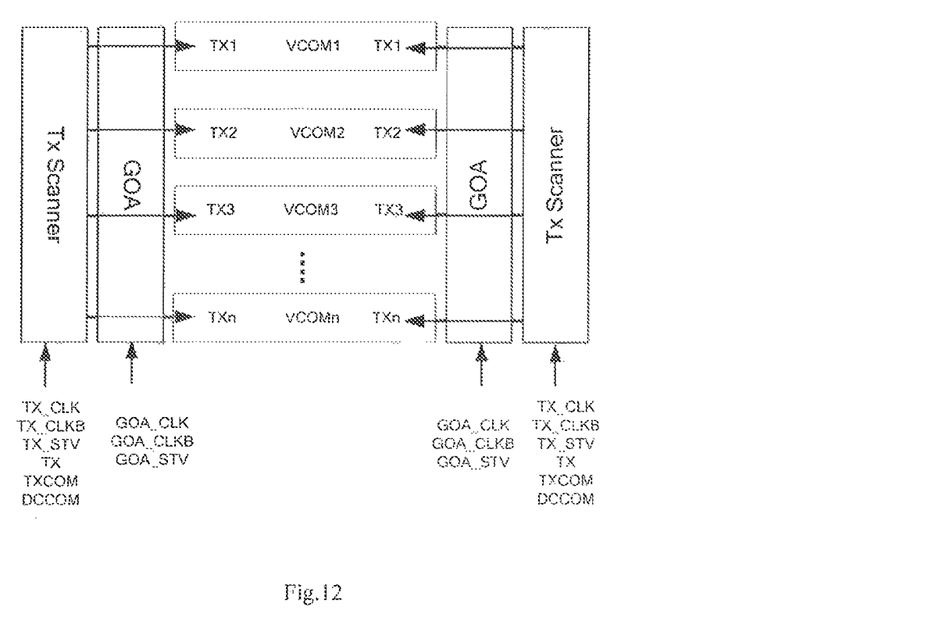
FIG. 12 is a schematic diagram of connection of external driving signals in a display apparatus provided in an embodiment of the present disclosure.

FIG. 12 shows a schematic diagram of connection of the external driving signals integrated with the emission electrode scanning circuit and GOA. As shown in FIG. 12, gate-driven external inputs (GOA_CLK, GOA_CLKB, GOA_STV) are output to the array substrate through GOA, and the external inputs (TX_CLK, TX_CLKB, TX_STV, TX, TXCOM, DCCOM) of the emission electrode scanning circuit are output to the array substrate through the emission electrode scanning circuit. Upon a comparison with FIG. 1, it can be seen that no matter how large the panel is, the external inputs of the emission electrode scanning circuit only comprises six signals in the figure, that is, using only six signal lines can drive the emission electrode scanning circuit to supply the TX driving signals to the emission electrodes (TX1, TX2, . . . , TXn), which can realize the narrow frame of the panel and reduce crosstalk between the signal lines and the control lines of GOA.

Exemplarily, common electrodes of multiple rows of pixels of the array substrate are corresponding to emission electrodes in one row.

There further provides in an embodiment of the present disclosure a display apparatus, comprising the array substrate described above.

The display apparatus can be any product or elements having a display function such as an electronic paper, a mobile phone, a tablet computer, a television, a display, a notebook computer, a digital photo frame and a navigator and the like.

The above descriptions are just exemplary embodiments of the present disclosure. It shall be pointed out that various improvements and modifications can be made without departing from the principle of the present disclosure for those skilled in the art and these improvements and modifications shall be deemed as falling into the protection scope of the present disclosure.

The present application claims the priority of a Chinese patent application No. 201410318306.1 filed on Jul. 4, 2014. Herein, the content disclosed by the Chinese patent application is incorporated in full by reference as a part of the present disclosure.

What is claimed is:

1. An emission electrode scanning circuit comprising a plurality of sub scanning circuits connected in cascades which have identical structures, each of which comprises:
   a shift register unit configured to shift a received start signal to obtain a start signal of a next stage of sub scanning circuit and an emission electrode driving control signal, and output the start signal of the next stage of sub scanning circuit to a shift register unit of the next stage of sub scanning circuit;
   a scanning signal generation unit connected to an emission electrode driving signal line and an output of the shift register unit, and configured to generate an emission electrode scanning signal according to only these two received signals, the emission electrode driving control signal received from the shift register unit and an emission electrode driving signal received from the emission electrode driving signal line; and
   a driving output unit configured to receive the emission electrode scanning signal from the scanning signal generation unit, convert a high level of a received emission electrode scanning signal into an emission electrode driving high level, convert a low level of the emission electrode scanning signal into an emission electrode driving low level, and output them to an emission electrode,
   wherein each of the plurality of sub scanning circuits provides a driving signal to the emission electrode respectively, and the plurality of sub scanning circuits shares the emission electrode driving signal line and needs only an input of one start signal to drive the emission electrode scanning circuit to send the emission electrode driving signal progressively.

2. The emission electrode scanning circuit according to claim 1, wherein the shift register unit is further configured to output an inverse signal of the emission electrode driving control signal to the scanning signal generation unit;
   the scanning signal generation unit comprises five thin film transistors, wherein a first thin film transistor and a second thin film transistor are P channel type thin film transistors, and a third thin film transistor, a fourth thin film transistor and a fifth thin film transistor are N channel type thin film transistors; and
   gates of the first thin film transistor and the fifth thin film transistor are connected to the inverse signal of the emission electrode driving control signal; a source of the first thin film transistor is connected to a bias high level, and a drain thereof is connected to a source of the second thin film transistor; and a source of the fifth thin film transistor is connected to an output terminal of the scanning signal generation unit, and a drain thereof is connected to a bias low level;
   gates of the second thin film transistor and the fourth thin film transistor are connected to the emission electrode driving signal line; a drain of the second thin film transistor is connected to the output terminal of the scanning signal generation unit; and a source of the fourth thin film transistor is connected to the bias low level, and a drain thereof is connected to a source of the third thin film transistor; and
   a gate of the third thin film transistor is connected to the emission electrode driving control signal, and a drain thereof is connected to the output terminal of the scanning signal generation unit.

3. The emission electrode scanning circuit according to claim 2, wherein the driving output unit comprises sixth, seventh, eighth, and ninth thin film transistors, wherein the sixth thin film transistor and the eighth thin film transistor are two P channel type thin film transistors, and the seventh thin film transistor and the ninth thin film transistor are N channel type thin film transistors; and
   gates of the sixth thin film transistor and the seventh thin film transistor are connected to the output terminal of the scanning signal generation unit; a source of the sixth thin film transistor is connected to the driving high level, and a drain thereof is connected to a drain of the seventh thin film transistor; and a source of the seventh thin film transistor is connected to the driving low level; and
   gates of the eighth thin film transistor and the ninth thin film transistor are connected to a drain of the seventh thin film transistor; a source of the eighth thin film transistor is connected to the driving high level, and a drain thereof is connected to the emission electrode; and a source of the ninth thin film transistor is connected to the bias low level, and a drain thereof is connected to the emission electrode.

4. The emission electrode scanning circuit according to claim 2, wherein the driving output unit comprises two transfer gates,
   wherein a positive control terminal of a first transfer gate and a negative control terminal of a second transfer gate are connected to the emission electrode scanning signal; the negative control terminal of the first transfer gate and the positive control terminal of the second transfer gate are connected to an inverse signal of the emission electrode scanning signal; and
   output terminals of the first transfer gate and the second transfer gate are connected to the emission electrode; a voltage input terminal of the first transfer gate is connected to the emission electrode driving low level, and a voltage input terminal of the second transfer gate is connected to the emission electrode driving high level.

5. The emission electrode scanning circuit according to claim 1, wherein
   the shift register unit is further configured to output the inverse signal of the emission electrode driving control signal to the scanning signal generation unit;
   the scanning signal generation unit comprises five thin film transistors, wherein a first thin film transistor and a second thin film transistor are P channel type thin film transistors, and a third thin film transistor, a fourth thin film transistor, and a fifth thin film transistor are N channel type thin film transistors; and
   gates of the first thin film transistor and the third thin film transistor are connected to the emission electrode driving signal line; a source of the first thin film transistor is connected to a bias high level, and a drain thereof is connected to a source of the second thin film transistor; and a source of the third thin film transistor is connected to a source of the fourth thin film transistor, and a drain thereof is connected to an output terminal of the scanning signal generation unit;

gates of the second thin film transistor and the fifth thin film transistor are connected to the inverse signal of the emission electrode driving control signal; a drain of the second thin film transistor is connected to the output terminal of the scanning signal generation unit; and a source of the fifth thin film transistor is connected to the bias low level, and a drain thereof is connected to the output terminal of the scanning signal generation unit; and a gate of the fourth thin film transistor is connected to the emission electrode driving control signal, and a source thereof is connected to the bias low level.

6. The emission electrode scanning circuit according to claim 5, wherein the driving output unit comprises sixth, seventh, eighth, and ninth thin film transistors, wherein the sixth thin film transistor and the eighth thin film transistor are two P channel type thin film transistors, and the seventh thin film transistor and the ninth thin film transistor are N channel type thin film transistors; and gates of the sixth thin film transistor and the seventh thin film transistor are connected to the output terminal of the scanning signal generation unit; a source of the sixth thin film transistor is connected to the driving high level, and a drain thereof is connected to a drain of the seventh thin film transistor; and a source of the seventh thin film transistor is connected to the driving low level; and gates of the eighth thin film transistor and the ninth thin film transistor are connected to a drain of the seventh thin film transistor; a source of the eighth thin film transistor is connected to the driving high level, and a drain thereof is connected to the emission electrode; and a source of the ninth thin film transistor is connected to the bias low level, and a drain thereof is connected to the emission electrode.

7. The emission electrode scanning circuit according to claim 1, wherein the scanning signal generation unit comprises a not-and gate and an inverter; one input terminal of the not-and gate is connected to the emission electrode driving signal line, and the other input terminal thereof is connected to the emission electrode driving control signal, and an output terminal thereof is connected to an input terminal of the inverter; and an output terminal of the inverter is connected to the output terminal of the scanning signal generation unit.

8. The emission electrode scanning circuit according to claim 1, wherein the driving output unit comprises two transfer gates, wherein a positive control terminal of a first transfer gate and a negative control terminal of a second transfer gate are connected to the emission electrode scanning signal; the negative control terminal of the first transfer gate and the positive control terminal of the second transfer gate are connected to an inverse signal of the emission electrode scanning signal; and output terminals of the first transfer gate and the second transfer gate are connected to the emission electrode; a voltage input terminal of the first transfer gate is connected to the emission electrode driving low level,
and a voltage input terminal of the second transfer gate is connected to the emission electrode driving high level.

9. An array substrate, comprising the emission electrode scanning circuit according to claim 1.

10. The array substrate according to claim 9, wherein the emission electrode scanning circuit is integrated in a seal region of the array substrate.

11. The array substrate according to claim 9, wherein common electrodes of multiple rows of pixels of the array substrate constitute one row of emission electrodes.

12. A display apparatus, comprising the array substrate according to claim 9.

13. The display apparatus according to claim 12, wherein the emission electrode scanning circuit is integrated in a seal region of the array substrate.

14. The display apparatus according to claim 12, wherein common electrodes of multiple rows of pixels of the array substrate constitute one row of emission electrodes.

15. The array substrate according to claim 9, wherein the shift register unit is further configured to output an inverse signal of the emission electrode driving control signal to the scanning signal generation unit;

the scanning signal generation unit comprises five thin film transistors, wherein a first thin film transistor and a second thin film transistor are P channel type thin film transistors, and a third thin film transistor, a fourth thin film transistor and a fifth thin film transistor are N channel type thin film transistors; and gates of the first thin film transistor and the fifth thin film transistor are connected to the inverse signal of the emission electrode driving control signal; a source of the first thin film transistor is connected to a bias high level, and a drain thereof is connected to a source of the second thin film transistor; and a source of the fifth thin film transistor is connected to an output terminal of the scanning signal generation unit, and a drain thereof is connected to a bias low level;

gates of the second thin film transistor and the fourth thin film transistor are connected to the emission electrode driving signal line; a drain of the second thin film transistor is connected to the output terminal of the scanning signal generation unit; and a source of the fourth thin film transistor is connected to the bias low level, and a drain thereof is connected to a source of the third thin film transistor; and a gate of the third thin film transistor is connected to the emission electrode driving control signal, and a drain thereof is connected to the output terminal of the scanning signal generation unit.

16. The array substrate according to claim 15, wherein the driving output unit comprises sixth, seventh, eighth, and ninth thin film transistors, wherein the sixth thin film transistor and the eighth thin film transistor are two P channel type thin film transistors, and the seventh thin film transistor and the ninth thin film transistor are N channel type thin film transistors; and gates of the sixth thin film transistor and the seventh thin film transistor are connected to the output terminal of the scanning signal generation unit; a source of the sixth thin film transistor is connected to the driving high level, and a drain thereof is connected to a drain of the seventh thin film transistor; and a source of the seventh thin film transistor is connected to the driving low level; and gates of the eighth thin film transistor and the ninth thin film transistor are connected to a drain of the seventh thin film transistor; a source of the eighth thin film transistor is connected to the driving high level, and a drain thereof is connected to the emission electrode; and a source of the ninth thin film transistor is connected to the bias low level, and a drain thereof is connected to the emission electrode.

17. The array substrate according to claim 9, wherein
the shift register unit is further configured to output the inverse signal of the emission electrode driving control signal to the scanning signal generation unit;
the scanning signal generation unit comprises five thin film transistors, wherein a first thin film transistor and a second thin film transistor are P channel type thin film transistors, and a third thin film transistor, a fourth thin film transistor, and a fifth thin film transistor are N channel type thin film transistors; and
gates of the first thin film transistor and the third thin film transistor are connected to the emission electrode driving signal line; a source of the first thin film transistor is connected to a bias high level, and a drain thereof is connected to a source of the second thin film transistor; and a source of the third thin film transistor is connected to a source of the fourth thin film transistor, and a drain thereof is connected to an output terminal of the scanning signal generation unit;
gates of the second thin film transistor and the fifth thin film transistor are connected to the inverse signal of the emission electrode driving control signal; a drain of the second thin film transistor is connected to the output terminal of the scanning signal generation unit; and a source of the fifth thin film transistor is connected to the bias low level, and a drain thereof is connected to the output terminal of the scanning signal generation unit; and
a gate of the fourth thin film transistor is connected to the emission electrode driving control signal, and a source thereof is connected to the bias low level.

18. The array substrate according to claim 17, wherein the driving output unit comprises sixth, seventh, eighth, and ninth thin film transistors, wherein the sixth thin film transistor and the eighth thin film transistor are two P channel type thin film transistors, and the seventh thin film transistor and the ninth thin film transistor are N channel type thin film transistors; and gates of the sixth thin film transistor and the seventh thin film transistor are connected to the output terminal of the scanning signal generation unit; a source of the sixth thin film transistor is connected to the driving high level, and a drain thereof is connected to a drain of the seventh thin film transistor; and a source of the seventh thin film transistor is connected to the driving low level; and
gates of the eighth thin film transistor and the ninth thin film transistor are connected to a drain of the seventh thin film transistor; a source of the eighth thin film transistor is connected to the driving high level, and a drain thereof is connected to the emission electrode; and a source of the ninth thin film transistor is connected to the bias low level, and a drain thereof is connected to the emission electrode.

19. The array substrate according to claim 9, wherein
the scanning signal generation unit comprises a not-and gate and an inverter; one input terminal of the not-and gate is connected to the emission electrode driving signal line, and the other input terminal thereof is connected to the emission electrode driving control signal, and an output terminal thereof is connected to an input terminal of the inverter; and an output terminal of the inverter is connected to the output terminal of the scanning signal generation unit.

20. The array substrate according to claim 9, wherein the driving output unit comprises two transfer gates,
wherein a positive control terminal of a first transfer gate and a negative control terminal of a second transfer gate are connected to the emission electrode scanning signal; the negative control terminal of the first transfer gate and the positive control terminal of the second transfer gate are connected to an inverse signal of the emission electrode scanning signal; and
output terminals of the first transfer gate and the second transfer gate are connected to the emission electrode; a voltage input terminal of the first transfer gate is connected to the emission electrode driving low level, and a voltage input terminal of the second transfer gate is connected to the emission electrode driving high level.

* * * * *